United States Patent

[19]

Haner

[11] Patent Number: 5,867,026
[45] Date of Patent: Feb. 2, 1999

[54] FLOW TUBE FOR NMR PROBE

[75] Inventor: Ronald L. Haner, San Francisco, Calif.

[73] Assignee: Varian Associates, Inc., Palo Alto, Calif.

[21] Appl. No.: 628,228

[22] Filed: Apr. 4, 1996

[51] Int. Cl.$^6$ .................................................. G01V 3/00
[52] U.S. Cl. ........................................ 324/321; 324/300
[58] Field of Search .................................. 324/318, 322, 324/321, 300

[56] References Cited

U.S. PATENT DOCUMENTS

| | | | |
|---|---|---|---|
| 4,246,537 | 1/1981 | Laukien et al. | 324/321 |
| 4,489,275 | 12/1984 | Sancier et al. | 324/315 |
| 4,775,836 | 10/1988 | Starewicz et al. | 324/318 |
| 5,150,054 | 9/1992 | Dupree | 324/318 |
| 5,258,712 | 11/1993 | Hofmann et al. | 324/318 |
| 5,302,900 | 4/1994 | Cummings | 324/321 |
| 5,397,989 | 3/1995 | Spraul | 324/318 |

FOREIGN PATENT DOCUMENTS

| | | | |
|---|---|---|---|
| 43 38 972 A1 | 5/1995 | Germany | B01L 3/00 |

OTHER PUBLICATIONS

James F. Haw et al., "Continuous Flow High Field Nuclear Magnetic Resonance", *Analytical Chemistry*, vol. 53, No. 14, Dec. 1981, pp. 2327–2331.

Ernst Bayer et al., "On Line Coupling of Liquid Chromatography and High–Field Nuclear Magnetic Resonance Spectrometry", *Analytical Chemistry*, vol. 54, No. 11, Sep. 1982, pp. 1747–1750.

David A. Laude, Jr., et al., "Direct–Link Analytic Scale High–Performance Liquid Chromatography/Nuclear Magnetic Resonance", *Analytical Chemistry*, vol. 56, No. 13, Nov. 1984, pp. 2471–2475.

David A. Laude, Jr., et al., "Nuclear Magnetic Resonance Detection For The On–Line Identification Of Liquid Chromatography Eluents", *Trends In Analytical Chemistry*, vol. 5, No. 9, 1986, pp. 230–235.

Klaus Albert et al., "High–Performance Liquid Chromatography—Nuclear Magnetid Resonance On–Line Coupling", *Trends In Analytical Chemistry*, vol. 7, No. 8, 1988, pp. 288–293.

H. Barjat et al., Mar. 1996, "Adaption of Commercial 500 Hhz for LCNMR", *Journal of Magnetic Resonance, Series A*, vol. 119, No. 1; pp. 115–119.

S. Stevenson and H.C. Dorn, Oct. 1994, "13C Dynamic Nuclear Polarization: A Detector for Continuous–Flow, On–Line Chromatography", *Analytical Chemistry*, vol. 66; pp. 2993–2999.

K. Albert and E. Bayer, Sep. 1988, "High–performance liquid chromatography–nuclear magnetic resonance on–line coupling", *Trends in Analytical Chemistry*, vol. 7; pp. 288–293.

*Primary Examiner*—Louis Arana

[57] ABSTRACT

A three-piece NMR detection cell comprises an inlet tube having a conically, tapered outlet nozzle, leading to an analysis tube, in turn leading to an outlet tube having a conically tapered inlet nozzle. The inlet and outlet tubes are inserted into the analysis tube at a distance from their inserted ends and sealed in a manner appropriate to their composition. When the detection cell is used in a coupled HPLC-NMR apparatus, increased NMR sensitivity and improved lineshape are obtained at low injection volumes while maintaining a low level of chromatographic band broadening and a high level of magnetic field homogeneity.

46 Claims, 5 Drawing Sheets

FLOW TUBE FOR NMR PROBE

FIELD OF THE INVENTION

The invention in general relates to the field of chemical analysis, more particularly to the fields of high-performance liquid chromatography (HPLC) and nuclear magnetic resonance spectroscopy (NMR), and still more particularly to a method which allows for the on-line coupling of the two analytical techniques. Specifically, the invention pertains to an NMR detection cell which allows for high resolution, high sensitivity and ease of use in NMR analyses, with minimal impairment of the separation capabilities of the HPLC.

BACKGROUND OF THE INVENTION

High-performance liquid chromatography (HPLC) is widely used to separate organic mixtures. Ultraviolet, refractive index and fluorescence detectors most commonly used with HPLC are not as powerful as infrared (IR), mass spectroscopy (MS) and NMR for qualitative analysis of the HPLC eluents. While infrared and mass spectroscopy have been successfully coupled with gas chromatography (GC) to provide both separation and powerful spectroscopic analysis, efforts to similarly couple HPLC to one of the preferred spectroscopic techniques have not been as successful.

After intensive development HPLC coupled mass spectroscopy is commercially available. Efforts to couple HPLC on-line to infrared spectroscopy have been hampered by solvent interferences. NMR, which provides unequaled structural information and which has sample requirements more reasonably matched to HPLC, would appear to be the preferred spectroscopic method to couple with HPLC.

Efforts to couple these two analytical methods have been hampered primarily by the low sensitivity of the NMR detector. Since the initial demonstration of on-line coupled HPLC-NMR in 1978, some improvements in NMR sensitivity have been achieved through the use of high field superconducting solenoid NMR magnets rather than iron magnets. See David A. Laude and Charles L. Wilkins, "Nuclear Magnetic Resonance Detection for the On-line Identification of Liquid Chromatography Eluents," Trends in Analytical Chemistry, vol. 5, no. 9, 1986, 230–35. The other means by which an increase in NMR sensitivity has been sought is through the use of preparative or semi-preparative scale columns or analytical scale columns which have overloaded with excessive injection volume.

There are numerous disadvantages to these two alternative. The higher injection volumes associated with either of these methods can result in excessive band broadening Band broadening may be increased further if after the column a large dead space is required in order to meet the sample premagnetization requirement. Additional disadvantages with these two methods include a rapid degradation of column efficiency and the generation of excessive amounts of solvent which must be properly disposed of.

A better approach would provide improved NMR sensitivity while allowing for column injection limits in the low microgram region. The invention described herein provides a method for improving NMR sensitivity and lineshape while maintaining a low level of chromatographic band broadening and a high level of magnetic field homogeneity.

SUMMARY OF THE INVENTION

In accordance with one aspect of the present invention, a detection cell is provided for use in nuclear magnetic resonance spectrometry. The detection cell includes an inlet tube with a conically tapered outlet nozzle; an analysis tube; and an outlet tube having a conically tapered inlet nozzle. All three tubes are composed of NMR-compatible material. The inner diameter of the analysis tube is greater than the inner diameter of the inlet tube and the outlet tube resulting in a small-to-large-to-small format.

the outlet end of the inlet tube is inserted into the inlet end of the analysis tube and the inlet end of the outlet tube is inserted into the outlet end of the analysis tube. The inlet and outlet tubes are sealed to the analysis tube in a manner appropriate to their composition at a distance from their inserted ends.

The inventive step is in the combination of the three tubes having different internal diameters in a manner that permits (1) a high mechanical strength in the small dimensions necessary for suitable pressure-tolerant connections form HPLC systems to NMR, and (2) inert sealing while maintaining a high degree of structural symmetry necessary for NMR sensitivity and resolution, as well as minimal effect on the fluid output of the liquid chromatograph.

Higher sensitivity of the NMR detector is obtained by increasing the signal to noise (S/N) ratio. By increasing the internal diameter of the analysis tube relative to the inlet and outlet tubes two things are achieved: signal strength increases because the observation volume is increased, and noise decreases because the diameter of glass is reduced. The observation volume is not increased to a point which would necessitate great increases in injection volume resulting in excessive band broadening.

The primary advantage of large analysis-tube volume is that the signal strength increases because for a given concentration of sample, the number of molecules increases within the detector. This permits smaller diameter coils which will contribute less noise depending upon the overall design.

The detection cell described can be used in either continuous flow-through analysis or stop-flow analysis.

DESCRIPTION OF ILLUSTRATIVE EMBODIMENTS

The following descriptions of illustrative embodiments of the invention are presented as lists of (i) features of illustrative apparatus or (ii) operations performed in illustrative methods, in either case mounted with the explanatory notes below. The descriptions are derived from certain claims in the application as originally filed, but of course the claims are not intended and should not be deemed to be limited to the illustrative embodiments so described.

Illustrative NMR Flow Cell

An NMR detection cell 105 in accordance with the invention comprises (a) an analysis tube 220 composed of an NMR-compatible material and having an inlet end, an outlet end, and an inner diameter.

(b) an inlet tube 210 composed of an NMR-compatible material and having an inlet end, an outlet end, and an inner diameter smaller than the inner diameter of the analysis tube, (c) an outlet tube 215 composed of an NMR-compatible material and having an inlet end, an outlet end, and an inner diameter smaller than the inner diameter of the analysis tube 220, (d) the outlet end of the inlet tube 210 having a conically tapered nozzle and being disposed substantially inside the inlet end of the analysis tube 220;

(e) the inlet end of the outlet tube 215 having a conically tapered nozzle and being disposed substantially inside the outlet end of the analysis tube 220;

(f) the inlet tube 210 being sealed to the analysis tube 220 at a substantial distance from the outlet end of the inlet tube 210; and (g) the outlet tube 215 being sealed to the analysis tube 220 at a substantial distance from the inlet end of the outlet tube 215.

The detection cell 105 may, but need not, be a flow-through cell. In other embodiments, the cell 105 may be used for stop-flow analysis of samples that are flowed in, analyzed, and drawn out, all at the inlet portion, with the outlet portion being used as a pressure controller as well known to those of ordinary skill in the field of sample automation. Furthermore, the cell 105 is not limited to liquid chromatography applications. The strength and symmetry of the design are applicable to flow-through NMR sample introduction in general. The small-to-large-to-small geometry reduces the amount of sample (analyte plus solvent) needed to fill the analysis tube 220 and places an increased proportion of the total sample volume into the analysis tube 220. This feature is useful for samples available in limited qualities, of which liquid chromatography fractions are one example.

The analysis tube 220 should be of a suitable thickness. As is well known to those of ordinary skill, too thin a tube is easily breakable during assembly and use; too thick a tube can reduce NMR sensitivity.

The analysis tube 220 may comprise an NMR-compatible material such as high purity quartz of a kind well known to those of ordinary skill. Other NMR-compatible materials that can be sealed sufficiently well may also be used, such as sapphire or a borosilicate glass composite such as PYREX®. It is also possible to use a material with a magnetic susceptibility that is balanced either to the magnetic susceptibility of a typical liquid-chromatography (LC) and NMR solvent mixture, or balanced to essentially-zero susceptibility, or balanced to air, or balanced to whatever other balance is regarded as appropriate for the particular application in question.

As known to those of ordinary skill, the inner diameter of the analysis tube 220 is chosen so that the total analysis volume and the optimal field length for the NMR magnet being used are compatible with LC applications. See generally, e.g., Klaus Albert and Ernst Bayer, "High-performance liquid chromatography—nuclear magnetic resonance on-line-coupling," Trends in Analytical Chemistry, vol. 7, no. 8, 1988, 288–93. It is often preferable to choose the analysis tube length based on the length of the field center or sensitive volume of the NMR magnet bore. Then, the inner diameter (i.d.) may be adjusted to a compromise point where LC integrity (which can be the primary consideration for small-volume samples) is balanced by NMR sensitivity (which can be the primary consideration for large-volume samples).

The same NMR-compatible material may be used for the analysis tube 220, the inlet tube 210, and the outlet tube 215. Alternatively, different materials may be used provided that a satisfactory seal can still be achieved, or less-expensive grades of material may be used for the inlet tube 210 and outlet tube 215 than for the analysis tube 220.

If desired, the inlet end of the inlet tube 210 (or the outlet end of the outlet tube 215, or both) can be ground, etched, machined, or otherwise formed to have knurling, grooves, or other patterning for an improved connector grip using conventional pressure fittings without settable adhesives. This is advantageous because it is often preferable to make the seal using inert methods, inasmuch as settable adhesives can react with or dissolve in the liquid-chromatography flow stream.

As is well known in the art, the small-to-large-to-small progression of inner diameters, from the inlet tube 210 to the analysis tube 220 to the outlet tube 215, helps maintain chromatographic separation when the flow tube 100 is used for chromatographic analysis.

Figure 1:
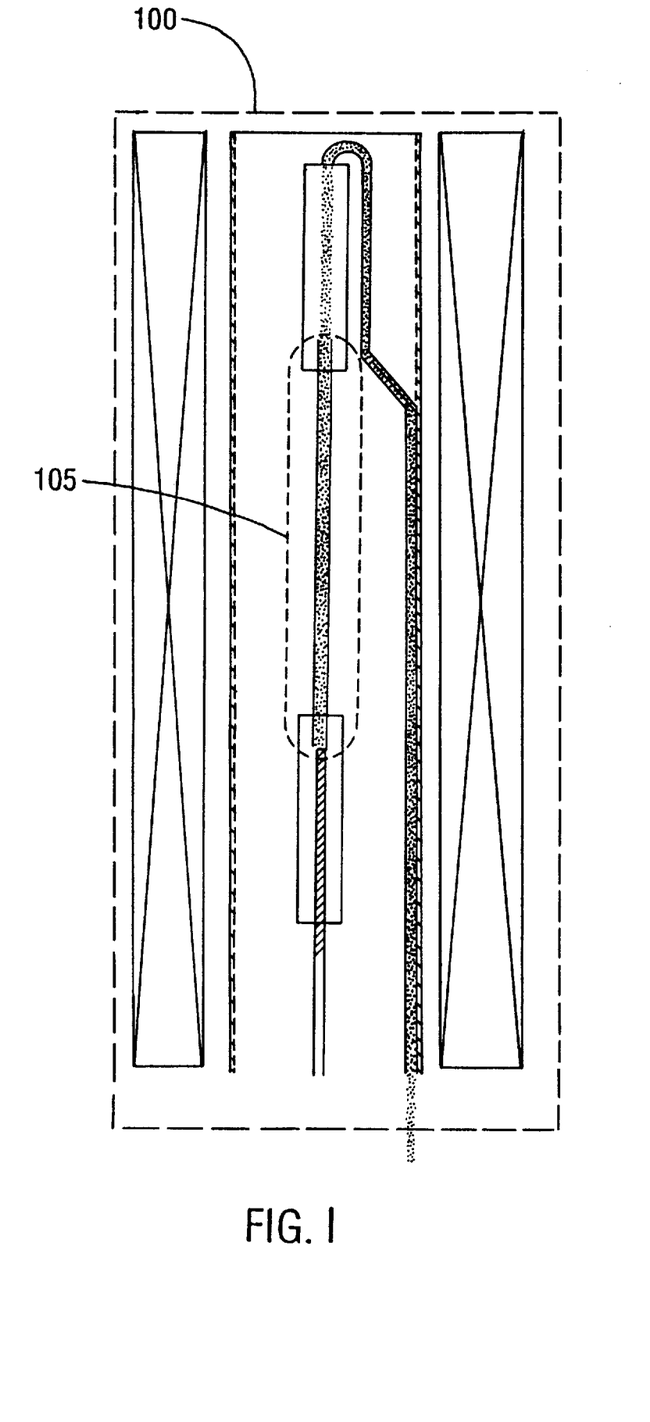
FIG. 1 is a schematic diagram of a NMR detection cell in a continuous flow cell arrangement 100.
Figure 2:
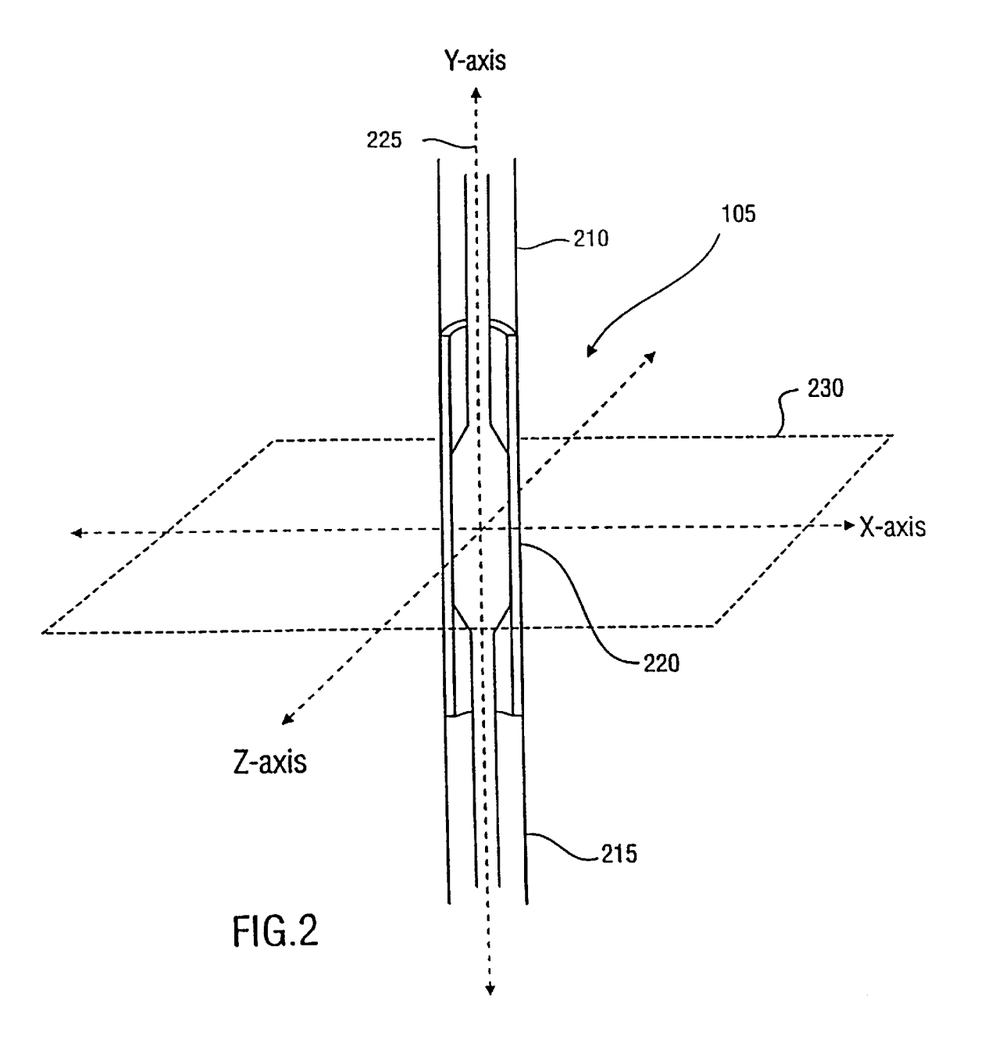
FIG. 2 shows an assembled detection flow cell as described herein.
Figure 3:
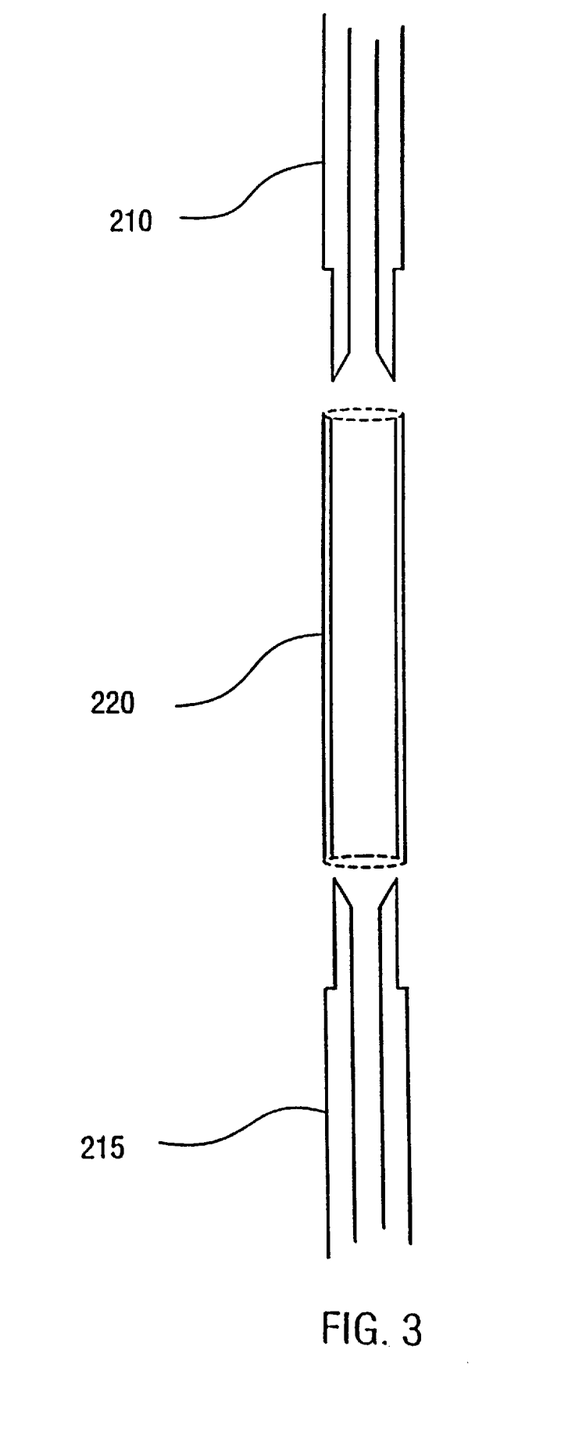
FIG. 3 shows three individual pieces of the detection flow cell prior to assembly.
Figure 4:
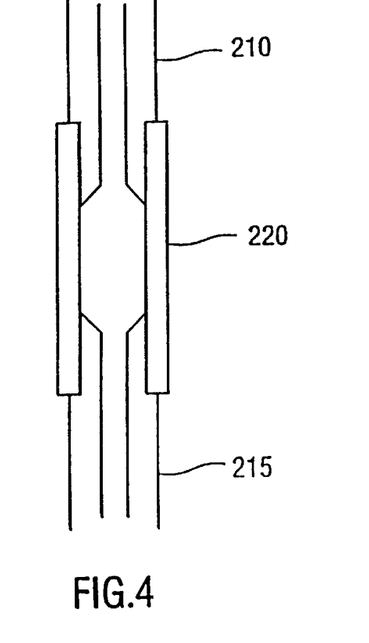
FIGS. 4–7 show several possible variations of the described detection flow cell.
Figure 5:
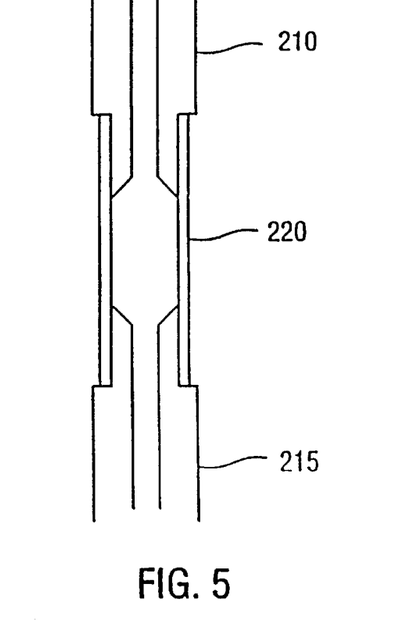
Figure 6:
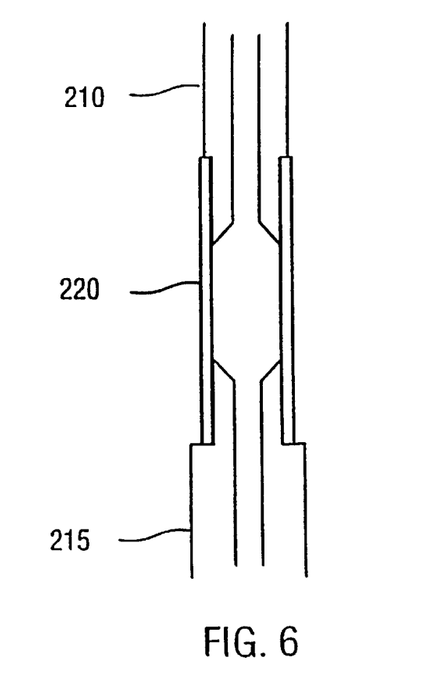
Figure 7:
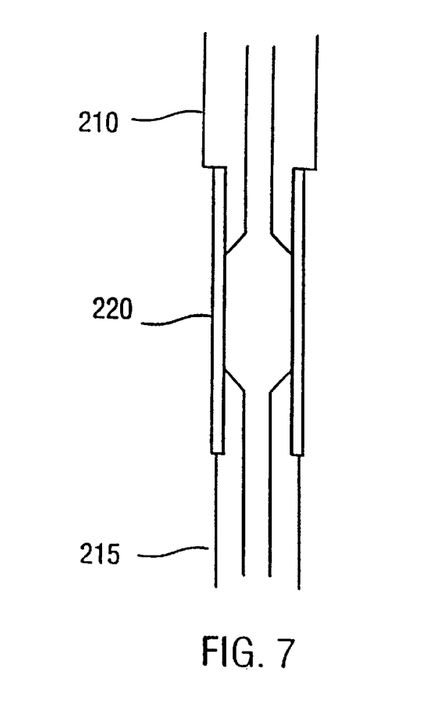

In one embodiment shown in FIG. 2, the outer diameter of the inlet and outlet tubes 210, 215 are stepped so that the assembled flow cell 100 has a substantially uniform outer diameter. In other embodiments shown in FIGS. 4–7, the outer diameter of the inlet tube 210, the outlet tube 215, or both may be smaller or larger than the outer diameter of the analysis tube 220. If the smaller diameter wall thickness was maintained over the entire length of the detection cell 105, it would not be very suitable for use in HPLC. The narrow walls at the inlet end of the inlet tube 210 and the outlet end of the outlet tube 215 would be susceptible to breakage when used with standard HPLC connectors. It is believed that optimum results may be obtained by using an inlet tube 210 and an outlet tube 215 having an outer diameter that is equal to or less than the outer diameter of the analysis tube. In some applications, difficulties may result if the outer diameters of the inlet tube 210, the outlet tube 215, or both are greater than the outer diameter of the analysis tube 220.

Tapered nozzles are believed to promote efficient flow-in and flush-out (i.e., flow-out) of liquid samples into and out of the analysis tube 220. Conical tapers have been used satisfactorily; it is believed that other forms of taper (e.g., conventional ellipsoidal tapers) will also be suitable. The nozzle of the inlet tube 210 is outwardly tapered and the nozzle of the outlet tube 215 is inwardly tapered with respect to the direction of flow.

The outlet end of the inlet tube 210 and the inlet end of the output tube 215 should be disposed far enough inside the analysis tube 220 that the remaining volume of the analysis tube 220 is suitable for both NMR and chromatographic applications. Determining, for specific implementations, the appropriate remaining volume and thus the amount by which the inlet tube 210 and outlet tube 215 ends should be inserted in the analysis tube 220 is readily accomplished by those of ordinary skill.

The inlet and outlet tubes 210, 215 may be sealed to the analysis tube 220 by heat sealing (e.g. for quartz), brazing (e.g., for sapphire), or other suitable techniques, with or without adhesive. It will be apparent to those of ordinary skill having the benefit of this disclosure that the insertable plug design facilitates symmetric sealing, whatever sealing approach is used.

Figure 8:
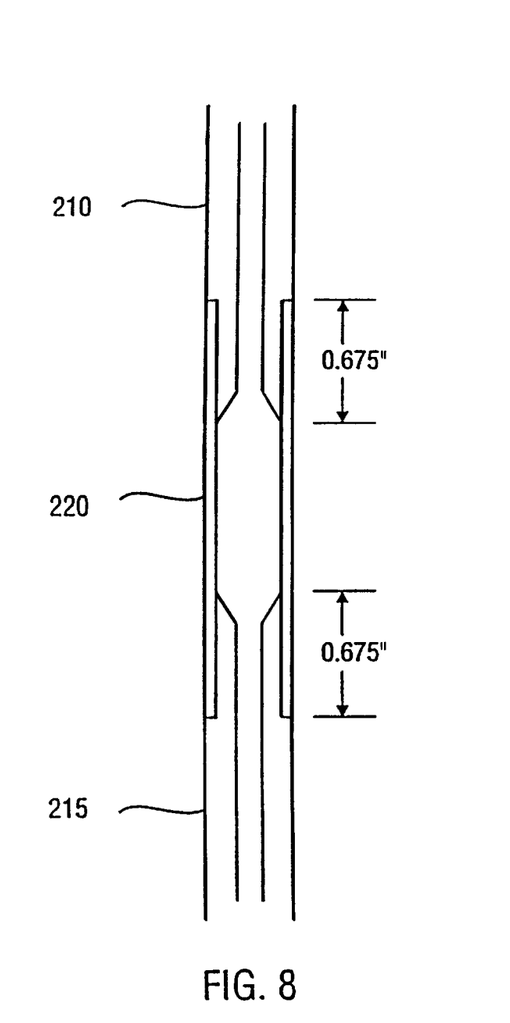
FIG. 8 shows an assembled detection flow cell indicating the depth of insertion of the inlet and outlet tubes into the analysis tube.

The seals between the analysis tube 220 and the inlet and outlet tubes 210, 215 should be far enough from the inserted ends of the inlet and outlet tubes 210, 215 so that the magnetic field perturbations caused by the seals will not unduly influence the magnetic field at the sensitive volume of the NMR magnet bor. In the illustrative embodiment shown in FIG. 8, a distance of 0.675 inches from the inserted ends to the sealing point has been found to be satisfactory.

Illustrative Method of Manufacture

A method of manufacturing an NMR flow cell 100 in accordance with the invention comprises:
   (a) providing an analysis tube 220 composed of an NMR-compatible material and having an inlet end, an outlet end, and an inner diameter;
   (b) providing an inlet tube 210 composed of an NMR-compatible material and having an inlet end, an outlet end, an inner diameter smaller than the inner diameter of the analysis tube 220, and a conically tapered nozzle,
   (c) providing an outlet tube 215 composed of an NMR-compatible material and having, an inlet end, an outlet end, an inner diameter smaller than the inner diameter of the analysis tube, and a conically tapered nozzle;
   (d) inserting the outlet end of the inlet tube 210 substantially inside the inlet end of the analysis tube 220;
   (e) inserting the inlet end of the outlet tube 215 substantially inside the outlet end of the analysis tube 220;
   (f) sealing the inlet tube 210 to the analysis tube 220 at a substantial distance from the outlet end of the inlet tube 210; and
   (g) sealing the outlet tube 215 being sealed to the analysis tube 220 at a substantial distance from the inlet end of the outlet tube 215.

The analysis tube 220, the inlet tube 210, and the outlet tube 215 should be precision-machined from a suitable NMR- and LC-compatible material such as high purity quartz of a kind well known to those of ordinary skill. The analysis tube 220 should be machined to the highest level of polish and symmetry available; the inlet and outlet tubes 210, 215 are machined to the highest level of symmetry available but preferably without polish. In one embodiment, machining is done without bevel or chamfer, i.e., to achieve square edges.

The inlet and outlet tubes 210, 215 are inserted with a precision-machined into the analysis tube 220 to minimize the annular gap as much as possible, to reduce the chance of trapping analytical fluids and contaminants in the annular gap.

Sealing of the inlet and outlet tubes 210, 215 to the analysis tube 220 should be done to the highest degree of symmetry available. If brazing materials are used, they should be NMR-compatible (i.e., substantially nonmagnetic) and chemically compatible (i.e. substantially chemically inert).

It may be desirable to couple the outlet end of the NMR detection cell to another detector or a sample collector or a suitable chain.

Illustrative Apparatus for Coupled HPLC and NMR Spectroscopic Measurements

An apparatus for carrying out coupled liquid chromatography and nuclear magnetic spectroscopy measurements in accordance with the invention comprises:
   (a) a liquid chromatograph (LC) for separating the components of an organic mixture;
   (b) a nuclear magnetic resonance (NMR) spectrometer including an NMR detection cell 105;
   (c) the NMR detection cell 105 comprising:
      (i) an analysis tube 220 composed of an NMR-compatible material and having an inlet end, an outlet end, and an inner diameter;
      (ii) an inlet tube 210 composed of an NMR-compatible material and having an inlet end, an outlet end, and an inner diameter smaller than the inner diameter of the analysis tube 220;
      (iii) an outlet tube 215 composed of an NMR-compatible material and having an inlet end, an outlet end, and an inner diameter smaller than the inner diameter of the analysis tube 220;
      (iv) the outlet end of the inlet tube 210 having a conically tapered nozzle and being disposed substantially inside the inlet end of the analysis tube 220;
      (v) the inlet end of the outlet tube 215 having a conically tapered nozzle and being disposed substantially inside the outlet end of the analysis tube 220;
      (vi) the inlet tube 210 being sealed to the analysis tube 220 at a substantial distance from the outlet end of the inlet tube 210; and
      (vii) the outlet tube 215 being sealed to the analysis tube 220 at a substantial distance from the inlet end of the outlet tube 215; and
   (d) the inlet end of the inlet tube 210 of the NMR detection cell 105 interconnected to the LC to receive the components of the organic mixture.
   (e) the outlet end of the outlet tube 215 of the NMR detection cell interconnected to another device.

Other Remarks

The NMR cell 105 described above is highly symmetrical about its own cylindrical axis 225 as well as about it own geometric center defined by a plane 230 perpendicular to the length of the flow cell 100. In use, the cell 105 can be positioned relative to the corresponding symmetries of the NMR magnet, which can ultimately result in improved NMR resolution and sensitivity. These characteristics make the cell 105 very suitable for use with, and for the further development of, flow-through NMR probes.

The cell 105 is also very suitable for use in high-performance liquid chromatography (HPLC), in part because the comparatively thick wall of the outer ends of the inlet and outlet tubes 210, 215 make the cell 105 readily adaptable for use with HPLC connectors. The cell 105 is particularly suitable for use in an apparatus for coupled HPLC and NMR spectroscopy measurements for the separation and detection of the components of an organic mixture using liquid chromatography followed by spectroscopic measurements on the components by NMR.

The comparatively thin walls of the analysis tube 220 provides increased analysis volume and thus increased NMR sensitivity, without the fragility that could result if thin walls were also used in the inlet and outlet tubes 210, 215 (which could be crushed by connectors).

The geometry of the cell 105 permits direct fixing of the NMR coil around the cell 105, resulting in a good filling factor, which in turn improves NMR sensitivity and at least partially offsets the loss of sensitivity associated with the nonrotation of the cell 105 in the NMR probe.

The cell 105 is readily manufacturable in quantity and can be installed in NMR probes without undue difficulty.

Figure 9:
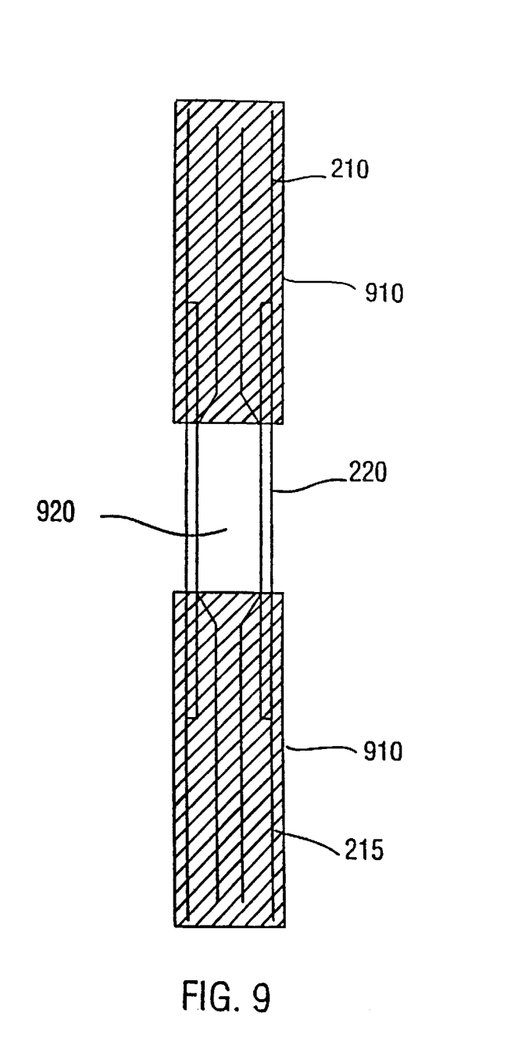
FIG. 9 shows an assembled detection flow cell equipped with ratio frequency (RF) shields.

NMR probes containing the cell 105 may be used with RF shields to reduce or eliminate parasitic excitation of a sample and delimit the sensitive volume of the NMR magnet bore. The use of such shields is conventional and forms no part of the detection cell 105 claimed herein. For example, RF shields 910 shown in FIG. 9 can be used with the described detection cell to restrict the NMR active volume 920, thereby minimizing or eliminating any detrimental effects on NMR resolution or sensitivity which might be associated with the three-piece cell 105. Sample entering the analysis tube 220 from the inlet tube 210 or exiting the analysis tube 220 into the outlet tube 215 may exhibit localized longitudinal discontinuity due to the change in internal diameter. The RF shields 910 can be placed to minimize any effects on the NMR signal caused by discontinuity. In placing the RF shields 910 as indicated, NMR pick-up in the annular region between the internal diameter of the analysis tube 220 and the internal diameters of the inlet and outlet tubes 210, 215 can be eliminated. Decrease in signal and increase in noise due to a greater total diameter of glass in these annular regions are also eliminated.

It will be appreciated by those of ordinary skill having the benefit of this disclosure that the illustrative embodiments described above are capable of numerous variations without departing from the scope and spirit of the invention. Accordingly, the exclusive rights sought to be patented are as described in the claims below.

What is claimed is:

1. An NMR detection cell comprising:
   (a) an analysis tube composed of an NMR-compatible material and having an inlet end, an outlet end, and an inner diameter;
   (b) an inlet tube composed of an NMR-compatible material and having an inlet end, an outlet end, and an inner diameter smaller than the inner diameter of the analysis tube,
   (c) an outlet tube composed of an NMR-compatible material and having an inlet end, an outlet end, and an inner diameter smaller than the inner diameter of the analysis tube,
   (d) the outlet end of the inlet tube having a conically tapered nozzle and being disposed substantially inside the inlet end of the analysis tube;
   (e) the inlet end of the outlet tube having a conically tapered nozzle and being disposed substantially inside the outlet end of the analysis tube;
   (f) the inlet tube being inertly sealed to the analysis tube at a substantial distance from the outlet end of the inlet tube; and
   (g) the outlet tube being inertly sealed to the analysis tube at a substantial distance from the inlet end of the outlet tube.

2. The NMR detection cell of claim 1, wherein the detection cell is used in a continuous-flow cell arrangement.

3. The NMR detection cell of claim 1, wherein the detection cell is used in a stop-flow cell arrangement.

4. The NMR detection cell of claim 1, wherein the analysis tube has a generally uniform inner diameter.

5. The NMR detection cell of claim 4, wherein the inlet tube has an outer diameter at the outlet end that is substantially equal to the inner diameter of the analysis tube.

6. An NMR detection cell comprising:
   (a) an analysis tube having an inlet end, an outlet end, and an inner diameter;
   (b) an inlet tube having an inlet end, an outlet end, and an inner diameter smaller than the inner diameter of the analysis tube,
   (c) an outlet tube having an inlet end, an outlet end, and an inner diameter smaller than the inner diameter of the analysis tube,
   (d) the outlet end of the inlet tube being disposed substantially inside the inlet end of the analysis tube;
   (e) the inlet end of the outlet tube being disposed substantially inside the outlet end of the analysis tube;
   (f) the inlet tube being inertly sealed to the analysis tube at a substantial distance from the outlet end of the inlet tube; and
   (g) the outlet tube being inertly sealed to the analysis tube at a substantial distance from the inlet end of the outlet tube.

7. The NMR detection cell of claim 6, wherein the inner diameter of the inlet tube is substantially equal to the inner diameter of the outlet tube.

8. The NMR detection cell of claim 6, wherein the outlet end of the inlet tube has a tapered nozzle.

9. The NMR detection cell of claim 6, wherein the inlet end of the outlet tube has a tapered nozzle.

10. The NMR detection cell of claim 6, wherein the inlet tube has an outer diameter at the inlet end that is substantially equal to the outer diameter of the analysis tube.

11. The NMR detection cell of claim 6, wherein the outlet tube has an outer diameter at the outlet end that is substantially equal to the outer diameter of the analysis tube.

12. The NMR detection cell of claim 6, wherein the inlet tube has an outer diameter at the inlet end that is larger than the outer diameter of the analysis tube.

13. The NMR detection cell of claim 6, wherein the inlet tube has an outer diameter at the inlet end that is smaller than the outer diameter of the analysis tube.

14. The NMR detection cell of claim 6, wherein the outlet tube has an outer diameter at the outlet end that is larger than the outer diameter of the analysis tube.

15. The NMR detection cell of claim 6, wherein the outlet tube has an outer diameter at the outer end that is smaller than the outer diameter of the analysis tube.

16. The NMR detection cell of claim 6, wherein the detection cell is used in a continuous-flow cell arrangement.

17. The NMR detection cell of claim 6, wherein the detection cell is used in a stop-flow cell arrangement.

18. The NMR detection cell of claim 6, wherein the analysis tube has a generally uniform inner diameter.

19. The NMR detection cell of claim 18, wherein the inlet tube has an outer diameter at the outlet end that is substantially equal to the inner diameter of the analysis tube.

20. A method of manufacturing an NMR detection cell comprising:
   (a) providing an analysis tube having an inlet end, an outlet end, and an inner diameter;
   (b) providing an inlet tube having an inlet end, an outlet end, and an inner diameter,
   (c) providing an outlet tube having an inlet end, an outlet end, and an inner diameter,
   (d) inserting the outlet end of the inlet tube substantially inside the inlet end of the analysis tube;
   (e) inserting the inlet end of the outlet tube substantially inside the outlet end of the analysis tube;
   (f) inertly sealing the inlet tube to the analysis tube at a substantial distance from the outlet end of the inlet tube; and
   (g) inertly sealing the outlet tube to the analysis tube at a substantial distance from the inlet end of the outlet tube.

21. A method of manufacture according to claim 20, wherein the analysis tube, inlet tube and outlet tube are composed of NMR compatible materials.

22. A method of manufacture according to claim 20, wherein the inner diameters of the inlet and outlet tubes are smaller than the inner diameter of the analysis tube.

23. The method of claim 20, wherein the analysis tube has a generally uniform inner diameter.

24. The method of claim 23, wherein the inlet tube has an outer diameter at the outlet end that is substantially equal to the inner diameter of the analysis tube.

25. An NMR detection cell comprising:
 (a) an analysis tube having an inlet end, an outlet end, and an inner diameter;
 (b) an inlet tube having an inlet end, an outlet end, and an inner diameter,
 (c) an outlet tube having an inlet end, an outlet end, and an inner diameter,
 (d) the outlet end of the inlet tube being disposed substantially inside the inlet end of the analysis tube;
 (e) the inlet end of the outlet tube being disposed substantially inside the outlet end of the analysis tube;
 (f) the inlet tube being inertly sealed to the analysis tube at a substantial distance from the outlet end of the inlet tube; and
 (g) the outlet tube being inertly sealed to the analysis tube at a substantial distance from the inlet end of the outlet tube.

26. The NMR detection cell of claim 25, wherein the inner diameters of the inlet and outlet tubes are smaller than the inner diameter of the analysis tube.

27. The NMR detection cell of claim 25, wherein the analysis tube, inlet tube and outlet tube are composed of NMR compatible materials.

28. The NMR detection cell of claim 25, wherein the outlet end of the inlet tube has a tapered nozzle.

29. The NMR detection cell of claim 25, wherein the inlet end of the outlet tube has a tapered nozzle.

30. The NMR detection cell of claim 25, wherein the analysis tube has a generally uniform inner diameter.

31. The NMR detection cell of claim 30, wherein the inlet tube has an outer diameter at the outlet end that is substantially equal to the inner diameter of the analysis tube.

32. An NMR detection cell comprising:
 (a) an analysis tube having an inlet end, an outlet end, and an inner diameter;
 (b) an inlet tube having an inlet end, an outlet end, and an inner diameter;
 (c) the outlet end of the inlet tube being disposed substantially inside and adjacent to the inlet end of the analysis tube; and
 (d) the inlet tube being inertly sealed to the analysis tube at a substantial distance from the outlet end of the inlet tube.

33. The NMR detection cell of claim 32, additionally comprising:
 (a) an outlet tube having an inlet end, an outlet end, and an inner diameter,
 (b) the inlet end of the outlet tube being disposed substantially inside the outlet end of the analysis tube; and
 (c) the outlet tube being sealed to the analysis tube at a substantial distance from the inlet end of the outlet tube.

34. The NMR detection cell of claim 33, wherein the inner diameter of the outlet tube is smaller than the inner diameter of the analysis tube.

35. The NMR detection cell of claim 33, wherein the outlet tube is composed of a NMR compatible material.

36. The NMR detection cell of claim 33, wherein the inlet end of the outlet tube has a tapered nozzle.

37. The NMR detection cell of claim 32, wherein the inner diameter of the inlet tube is smaller than the inner diameter of the analysis tube.

38. The NMR detection cell of claim 32, wherein the analysis tube and inlet tube are composed of NMR compatible materials.

39. The NMR detection cell of claim 32, wherein the outlet end of the inlet tube has a tapered nozzle.

40. The NMR detection cell of claim 32, wherein the analysis tube has a generally uniform inner diameter.

41. The NMR detection cell of claim 40, wherein the inlet tube has an outer diameter at the outlet end that is substantially equal to the inner diameter of the analysis tube.

42. An apparatus for carrying out coupled liquid chromatography and nuclear magnetic resonance spectroscopy measurements, the apparatus comprising:
 (a) a liquid chromatograph (LC) for separating the components of an organic mixture;
 (b) a nuclear magnetic resonance (NMR) spectrometer including an NMR detection cell;
 (c) the NMR detection cell comprising:
  (i) an analysis tube composed of an NMR-compatible material and having an inlet end, an outlet end, and an inner diameter;
  (ii) an inlet tube composed of an NMR-compatible material and having an inlet end, an outlet end, and an inner diameter smaller than the inner diameter of the analysis tube;
  (iii) an outlet tube composed of an NMR-compatible material and having an inlet end, an outlet end, and an inner diameter smaller than the inner diameter of the analysis tube;
  (iv) the outlet end of the inlet tube having a conically tapered nozzle and being disposed substantially inside the inlet end of the analysis tube;
  (v) the inlet end of the outlet tube having a conically tapered nozzle and being disposed substantially inside the outlet end of the analysis tube;
  (vi) the inlet tube being inertly sealed to the analysis tube at a substantial distance from the outlet end of the inlet tube; and
  (vii) the outlet tube being inertly sealed to the analysis tube at a substantial distance from the inlet end of the outlet tube; and
 (d) the inlet end of the outlet tube of the NMR detection cell interconnected to the LC to receive the components of the organic mixture.

43. The apparatus of claim 42, wherein the detection cell is used in a continuous-flow cell arrangement.

44. The apparatus of claim 43, wherein the detection cell is used in a stop-flow cell arrangement.

45. The apparatus of claim 42, wherein the analysis tube has a generally uniform inner diameter.

46. The apparatus of claim 45, wherein the inlet tube has an outer diameter at the outlet end that is substantially equal to the inner diameter of the analysis tube.

* * * * *